US010475509B2

(12) United States Patent
Molas et al.

(10) Patent No.: US 10,475,509 B2
(45) Date of Patent: *Nov. 12, 2019

(54) METHOD FOR MANAGING THE ENDURANCE OF A NON-VOLATILE REWRITABLE MEMORY AND DEVICE FOR PROGRAMMING SUCH A MEMORY

(71) Applicant: COMMISSARIAT A L'ENERGIE ATOMIQUE ET AUX ENERGIES ALTERNATIVES, Paris (FR)

(72) Inventors: Gabriel Molas, Grenoble (FR); Michel Harrand, Saint-Egreve (FR); Elisa Vianello, Grenoble (FR)

(73) Assignee: COMMISSARIAT A L'ENERGIE ATOMIQUE ET AUX ENERGIES ALTERNATIVE, Paris (FR)

( * ) Notice: Subject to any disclaimer, the term of this patent is extended or adjusted under 35 U.S.C. 154(b) by 0 days.

This patent is subject to a terminal disclaimer.

(21) Appl. No.: 15/975,206

(22) Filed: May 9, 2018

(65) Prior Publication Data
US 2018/0330783 A1 Nov. 15, 2018

(30) Foreign Application Priority Data
May 9, 2017 (FR) ..................................... 17 54044

(51) Int. Cl.
*G11C 11/00* (2006.01)
*G11C 13/00* (2006.01)
*G11C 29/02* (2006.01)

(52) U.S. Cl.
CPC ........ *G11C 13/0035* (2013.01); *G11C 13/004* (2013.01); *G11C 13/0007* (2013.01);
(Continued)

(58) Field of Classification Search
CPC ............ G11C 13/0035; G11C 13/0007; G11C 13/0011; G11C 13/0033; G11C 13/0038;
(Continued)

(56) References Cited

U.S. PATENT DOCUMENTS 9,047,948 B1 6/2015 Dinh et al.
9,142,292 B2 * 9/2015 Kanzawa ........... G11C 13/0007
(Continued)

FOREIGN PATENT DOCUMENTS

WO WO 2011/103379 A2 8/2011

OTHER PUBLICATIONS

Search Report as issued in French Patent Application No. 1754044, dated Jan. 22, 2018.

*Primary Examiner* — Viet Q Nguyen
(74) *Attorney, Agent, or Firm* — Pillsbury Winthrop Shaw Pittman LLP

(57) ABSTRACT

A method for managing the endurance of a non-volatile rewritable memory including a dielectric material layer that switches between a high resistance state, with a first resistance value, and a low resistance state, with a second resistance value, the method including at least one of the following operations: at the end of each erasure operation: reading the first resistance value and comparing it with a first predetermined median resistance value, and determining the writing programming conditions from the comparison results; and at the end of each writing operation: reading the second resistance value and comparing it with a second predetermined median resistance value, and determining the erasure programming conditions from the comparison results, linking the programming conditions and the first and second read resistance values, the writing and erasure programming conditions being applied to the electrodes of the stack during the following writing and/or erasure operations.

9 Claims, 3 Drawing Sheets

(52) U.S. Cl.
CPC ...... *G11C 13/0011* (2013.01); *G11C 13/0033* (2013.01); *G11C 13/0038* (2013.01); *G11C 13/0069* (2013.01); *G11C 13/0097* (2013.01); *G11C 29/021* (2013.01); *G11C 29/028* (2013.01); *G11C 2013/009* (2013.01); *G11C 2013/0076* (2013.01); *G11C 2013/0078* (2013.01); *G11C 2013/0092* (2013.01); *G11C 2213/32* (2013.01)

(58) Field of Classification Search
CPC . G11C 13/04; G11C 13/0069; G11C 13/0097; G11C 29/021; G11C 29/028
USPC .......................................... 365/148, 185.02
See application file for complete search history.

(56) References Cited

U.S. PATENT DOCUMENTS

| | | | |
|---|---|---|---|
| 9,183,926 B2 * | 11/2015 | Takagi | G11C 13/0007 |
| 9,263,129 B2 * | 2/2016 | Cabout | G11C 13/0007 |
| 9,431,607 B2 * | 8/2016 | Molas | G11C 13/0011 |
| 9,449,688 B2 * | 9/2016 | Thomas | G11C 13/0097 |
| 9,633,725 B2 * | 4/2017 | Molas | G11C 13/0011 |
| 9,722,177 B2 * | 8/2017 | Molas | H01L 45/08 |
| 9,748,477 B2 * | 8/2017 | Molas | H01L 45/1253 |
| 10,002,664 B2 * | 6/2018 | Vianello | G11C 13/0011 |
| 2011/0205782 A1 | 8/2011 | Costa et al. | |
| 2013/0058153 A1 | 3/2013 | Chang et al. | |
| 2013/0198436 A1 | 8/2013 | Bandic et al. | |
| 2014/0328108 A1 | 11/2014 | Nazarian et al. | |
| 2015/0243353 A1 | 8/2015 | Lee et al. | |
| 2018/0330786 A1 * | 11/2018 | Molas | G11C 13/0007 |

\* cited by examiner

METHOD FOR MANAGING THE ENDURANCE OF A NON-VOLATILE REWRITABLE MEMORY AND DEVICE FOR PROGRAMMING SUCH A MEMORY

CROSS REFERENCE TO RELATED APPLICATIONS

This application claims priority to French Patent Application No. 1754044, filed May 9, 2017, the entire content of which is incorporated herein by reference in its entirety.

FIELD

The present invention relates to a method for managing the endurance of a non-volatile rewritable memory. The invention also relates to a device for programming such a non-volatile rewritable memory.

The invention finds applications in the field of non-volatile rewritable memories and, more specifically, that of resistive random access memories of OxRRAM (Oxide-based Resistive RAM) and CBRAM (Conductive Bridging RAM) type.

BACKGROUND

In the field of non-volatile rewritable memories, different types of memories are used as a function of the targeted applications and performances. The memories the most commonly used, in particular in digital cameras, cell phones, portable computers, USB keys, and other portable devices, are memories called "Flash memories". Flash memories offer, notably, high integration density, high impact resistance, and good durability.

Most commercially available non-volatile Flash memories use the storage of charges as principle for encoding information. In practice, a charge trapping layer (generally polysilicon, or a dielectric such as SiN) is encapsulated between two dielectrics in the gate stack of an MOS transistor. The presence or the absence of charge in this medium modifies the conduction of the MOS transistor and makes it possible to encode the state of the memory.

However, the evolution of microelectronics requires every greater miniaturisation of components and, in particular, non-volatile rewritable memories. Yet, the miniaturisation of Flash technology is limited, notably by the fact that the thickness of the charge trapping layer cannot be reduced below a minimum value (of the order of 6 nm) otherwise the information retention time would be decreased.

Recently, a new type of memory, called resistive random access memories, have appeared to replace Flash memories. These resistive random access memories are not based on the charge trapping of the gates of transistors, but on a change of state of a resistive block. Resistive random access memories, notably oxide-based resistive random access memories, known as OxRRAM, and resistive random access memories based on ion conducting material, known as CBRAM (conductive bridging random access memories), are based on a change of the resistance state (high or low resistance) of an active material integrated between two metal electrodes. This new type of memory enables not only high integration density but also high operating speed, great endurance and good compatibility with the manufacturing methods currently used in the microelectronics industry, in particular with end-of-line CMOS technology methods.

A resistive random access memory generally includes a plurality of memory cells, also called memory points. Each memory cell comprises a stack 10 of a first and a second electrodes, generally made of metal, and a layer made of active material, for example a metal oxide, arranged between the two electrodes. An example of a resistive random access memory cell is represented in FIG. 1. This resistive random access memory comprises a first electrode 11, a second electrode 12 and a layer made of dielectric material 13 laid out between the first and second electrodes. The second electrode 12 of the resistive random access memory is arranged in contact with a connector substrate 14 ensuring an electrical contact between a programming device and the stack. The programming device makes it possible to control the programming conditions, for example the programming voltage, applied to the electrodes 11 and 12 of the stack.

The layer made of dielectric material 13, also called active layer, is capable of switching, in a reversible manner, between two resistance states which correspond to the logic values "0" and "1" used to encode an information bit. Thus, a resistive random access memory stack can switch from a low resistance state (LRS) to a high resistance state (HRS) by the application of a first voltage VRESET between the first 11 and the second 12 electrodes, and switch back from the high resistance state HRS to the low resistance state LRS by the application of a second voltage VSET between the first and second electrodes. In particular, an information is written in the memory cell by switching the layer made of dielectric material from the high resistance state HRS, also called "OFF" state, to the low resistance state LRS, or "ON" state. Conversely, an information may be erased from the memory cell by switching the layer made of dielectric material from the state LRS to the state HRS. The writing operation in the memory cell is called "SET"; the erasure operation of said memory cell is called "RESET".

Thus, during a writing operation, the dielectric material comprises a first resistance value and, during an erasure operation, it comprises a second resistance value, less than the first resistance value. The change in resistance of the dielectric material is governed by the formation and the rupture of a conductive filament of nanometric section between the two electrodes 11-12. According to our current state of knowledge, this filament seems to be due to different phenomena, depending on the type of material used for the layer of active material. In particular, in an OxRRAM type resistive random access memory in which the layer of dielectric material is oxide based, the change in resistance state seems to be explained by the formation of a filament of oxygen vacancies within said layer of dielectric material. In a CBRAM type resistive random access memory, in which the layer of dielectric material comprises an ion conducting material forming an ion conducting solid electrolyte arranged between an electrode forming an inert cathode and an electrode comprising a portion of ionisable metal, the change in resistance state seems to be explained by the formation of a conductive filament within the layer of dielectric material.

However, in resistive random access memories, there exists a certain variability in the resistance levels, both in the low resistance state LRS and in the high resistance state HRS. Indeed, at each operation of writing and erasure of the memory, the values of the resistance Roff in the high resistance state HRS and the values of the resistance Ron in the low resistance state LRS fluctuate, as represented by the fluctuation curves of the resistances Roff and Ron of FIG. 2.

Moreover, as the writing and erasure cycles of the memory progress, the levels of the resistances of the dielectric material drift, moving away more and more from the resistance values of the first cycles, as shown in FIG. 2. On account of these drifts, the writing and erasure conditions—for example the writing voltage or the erasure voltage—have to be modified to enable the writing or the erasure of a dielectric material. These modifications generally consist in applying a very high voltage or, quite the opposite, a very low voltage. Yet, the application of too weak writing or erasure conditions prevents any writing and the application of too strong writing or erasure conditions generates defects in the dielectric material, which degrades said dielectric material. The performances of resistive random access memories thus have a tendency to degrade more and more over cycles of writing and erasure. The endurance performances of these memories are thus relatively restricted.

To overcome this problem of endurance and thereby extend the lifetime of resistive random access memories, it is known to use a so-called "smart programming" method, which has the objective of compensating the defects that have built up in the course of several cycles of writing and erasure of the memory. To do so, the smart programming method proposes applying a compensation voltage which increases progressively until the dielectric material reaches a target resistance value. In other words, this method proposes determining a target resistance value considered as the optimal resistance value to reach. A compensation voltage—or a duration or a number of pulses at constant voltage level—intended to compensate the defects in the dielectric material, is next applied from a low value which is increased step by step until the resistance reaches the predetermined target value. The compensation conditions (voltage or pulse duration) are applied to compensate defects within the dielectric material not just in its low resistance state but also in its high resistance state.

FIGS. 3A and 3B represent curves, respectively, of the resistance values of the dielectric material and the values of the compensation voltage applied to the memory, in the course of cycles, when a smart programming method is used. As these curves show, when a writing ("set" curve) and erasure ("reset" curve) compensation voltage is applied, the value of the resistance increases. However, the increase in resistance values is only momentary, the resistance values again decreasing rapidly in the course of cycles following the application of the compensation voltage. Indeed, since the voltage compensation is only carried out after a certain number of cycles—for example at around $10^2$ and $10^4$ cycles in FIGS. 3A-3B—the memory has already greatly deteriorated when the compensation voltage is applied. This compensation thus camouflages the defects generated as the cycles progress, without however repairing them. Indeed, the defects of the dielectric material behind the modification of the resistance levels of the dielectric material are irreversible. Thus it is not possible to repair them, but only to compensate them.

Yet, the compensation of these defects with the smart programming method requires the application of strong compensation conditions, for example a high compensation voltage. Yet, strong compensation conditions generate new defects within the dielectric material; and the stronger the compensation conditions, the higher the number of defects.

To compensate the defects as precisely as possible, it could be envisaged to increase the level of the compensation conditions very slowly, with a very short step, until the level is reached that is just sufficient to compensate the defects, without generating too many additional defects. However, such a practice would be so long that it would not be exploitable industrially.

SUMMARY

To respond to the aforementioned problem of the momentary compensation of defects in the dielectric material, the Applicant proposes a method for managing the endurance of a resistive random access memory in which the programming conditions are determined at the end of each writing or erasure operation in order to limit resistance drifts at each operation and, thus, slow down the degradation of the memory.

According to a first aspect, the invention relates to a method for managing the endurance of a non-volatile rewritable memory including a plurality of ordered stacks of a lower electrode, a layer of dielectric material and an upper electrode, the dielectric material of each stack being capable of switching between:
  a high resistance state, in which the dielectric material has a first resistance value (Roff), and
  a low resistance state, in which the dielectric material has a second resistance value (Ron),
a switching between the high resistance state and the low resistance state allowing a writing in the memory and a switching between the low resistance state and the high resistance state allowing an erasure in the memory, This method is characterised by the fact that it comprises, for each stack, at least one of the following operations:
  at the end of each erasure operation: reading the first resistance value of the dielectric material, comparing the first resistance value with a first predetermined median resistance value and determining the writing programming conditions from the results of the comparison; and
  at the end of each writing operation: reading the second resistance value of the dielectric material, comparing the second resistance value with a second predetermined median resistance value and determining the reading programming conditions from the results of the comparison,
the first and second median resistance values (Roffmed, Ronmed) following, respectively, a first and a second predetermined dependency laws (Ld1; Ld2), linking the programming conditions and the first and second read resistance values,
the writing and erasure programming conditions being applied to the electrodes of the stack during, respectively, following operations of writing and erasure in order to limit the generation of defects in the dielectric material in the course of writing and erasure operations.

The fact of limiting defects in the dielectric material, at each writing or erasure operation, makes it possible to stabilise the resistance drifts of each memory cell of a resistive random access memory. This stability of resistance drifts increases the endurance of the memory and thus its lifetime.

The use of dependency laws makes it possible to adapt the method of the invention to all types of resistive random access memories, each type of resistive random access memory having its own dependency laws.

In the description that follows, the expression "writing operation" defines a step of writing data in a memory cell and the expression "erasure operation" defines a step of erasing this same data. A writing operation followed by an erasure operation constitutes a writing and erasure cycle, more simply called cycle.

Thus, the expression "programming conditions" is to be interpreted as the conditions for writing in a memory cell and/or erasing this memory cell. The programming conditions may thus be conditions for writing or conditions for erasing a memory cell. The writing programming conditions are determined as a function of a completed erasure operation, called preceding erasure operation, with the aim of being applied to the following writing operation. In a similar manner, the erasure programming conditions are determined as a function of a completed writing operation, called preceding writing operation, with the aim of being applied to the following erasure operation.

According to certain alternatives, only the operations of writing or only the operations of erasure may be carried out with the programming conditions determined in the manner defined above. According to other alternatives, both the writing operations and the erasure operations are carried out with the programming conditions determined in the manner defined above.

According to one alternative, the programming conditions include a programming voltage applied between the electrodes of each stack for a constant duration.

According to another alternative, the programming conditions include a duration of application of a voltage between the electrodes of each stack, the voltage being constant.

Beneficially, each dependency law is calibrated prior to all operations of writing and erasure. They may be calibrated by measurements or by calculations from parameters specific to each type of resistive random access memory.

According to certain embodiments, the read programming conditions are memorised at least partially up to the following writing or erasure operations, in at least one memory cell of the memory.

According to a second aspect, the invention relates to a device for programming a non-volatile rewritable memory comprising a programming circuit connected to the electrodes of each stack of the memory. This device is characterised by the fact that it implements the method defined above.

According to certain embodiments, the programming circuit comprises a plurality of voltage generators each capable of generating at least one programming voltage value.

According to other embodiments, the programming circuit comprises at least one voltage generator connected to dividing bridges.

These different embodiments make it possible to vary the programming voltage in order that the voltage applied to the electrodes is as close as possible to the determined voltage value.

According to yet other embodiments, the programming circuit comprises at least one voltage generator connected to at least one counter and/or one clock capable of modulating a duration of application of a constant voltage to the electrodes.

These embodiments make it possible to vary the programming conditions with a simple and inexpensive circuit.

BRIEF DESCRIPTION OF THE FIGURES

Other benefits and characteristics of the invention will become clear from reading the description, illustrated by the figures in which.

DETAILED DESCRIPTION

An example of a method for managing the endurance of a resistive random access memory is described in detail hereafter, with reference to the appended drawings. This example illustrates the characteristics and benefits of the invention. It is however recalled that the invention is not limited to this example.

In the figures, identical elements are marked by identical references. For reasons of legibility of the figures, the size scales between represented elements are not respected.

Figure 1:
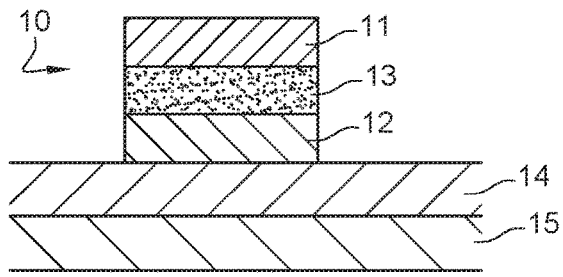
FIG. 1, already described, schematically represents an example of a memory cell of a resistive random access memory.
Figure 2:
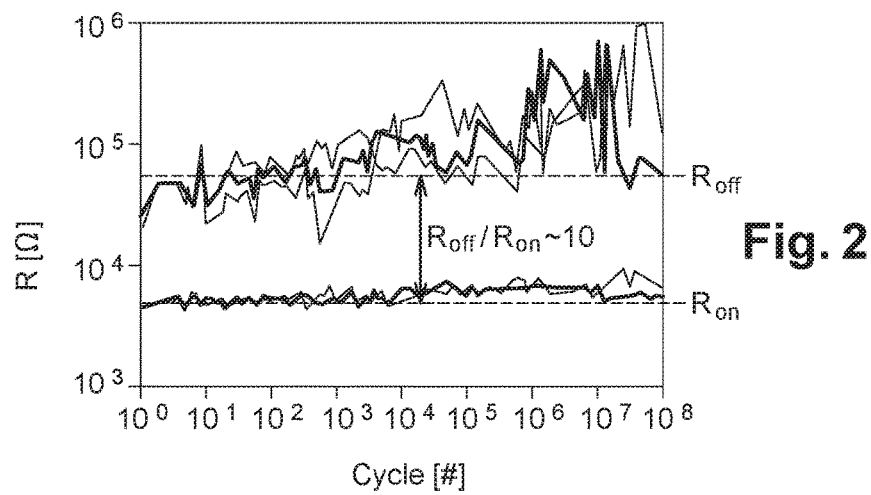
FIG. 2, already described, represents examples of evolution of the resistances Roff and Ron of a memory cell in the course of cycles.
Figures 3A, 3B:
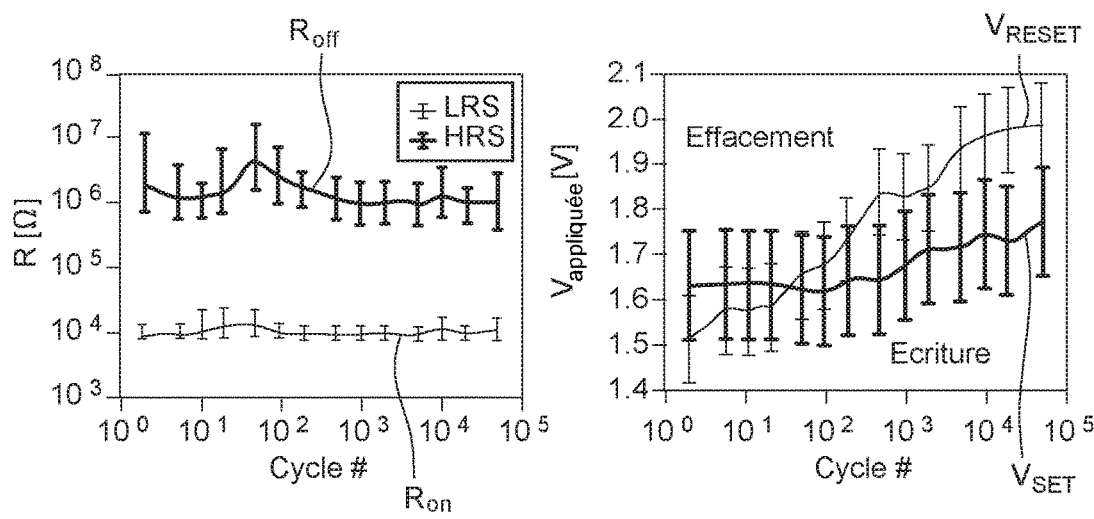
FIGS. 3A and 3B, already described, represent examples of evolution of the resistances Roff and Ron, as a function of the writing and erasure voltages, during an implementation of the smart programming method.

The method for managing endurance according to an embodiment of the invention is implemented in a resistive random access memory comprising a plurality of memory cells, of the type of that represented in FIG. 1 described previously. Each memory cell comprises a stack 10, formed of a lower electrode 12, an upper electrode 11 and a layer of dielectric material 13 and associated with a programming circuit 15 capable of applying a potential difference between the two electrodes 11 and 12. Several memory cells are laid out next to each other, on one or more levels to form a resistive random access memory.

The layer of dielectric material 13, for example a layer made of hafnium oxide ($HfO_2$), is capable of passing from a low resistance state LRS to a high resistance state HRS, and vice versa, under the effect of a voltage applied between the upper and lower electrodes. In the low resistance state, the dielectric material has a resistance of a value Ron; in the high resistance state, the dielectric material has a resistance of a value Roff, greater than Ron. Switching of the dielectric material from the high resistance state HRS to the low resistance state LRS makes it possible to write data; switching of the dielectric material from the low resistance state LRS to the high resistance state HRS makes it possible to erase data.

The method of an embodiment of the invention proposes limiting drifts in the resistances Roff and Ron at each cycle, that is to say at each writing operation and at each erasure operation, in such a way as to reduce, or even prevent, the formation of defects in the dielectric material 13. To do so, the method of an embodiment of the invention proposes determining the programming conditions as a function of median resistance values. In particular, the method proposes determining the programming conditions such that, in the high resistance state HRS, the resistance Roff of the dielectric material fluctuates around a first median resistance value Roffmed and that, in the low resistance state LRS, the resistance Ron of the dielectric material fluctuates around a second median resistance value Ronmed.

Figure 4A:
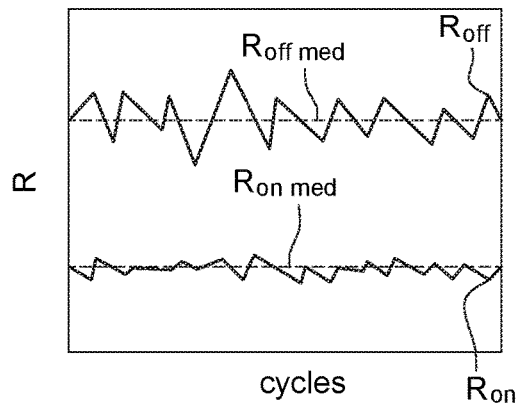
FIGS. 4A and 4B represent examples of evolution and distribution of the resistances Roff and Ron, during an implementation of the method according to an embodiment of the invention.
Figure 4B:
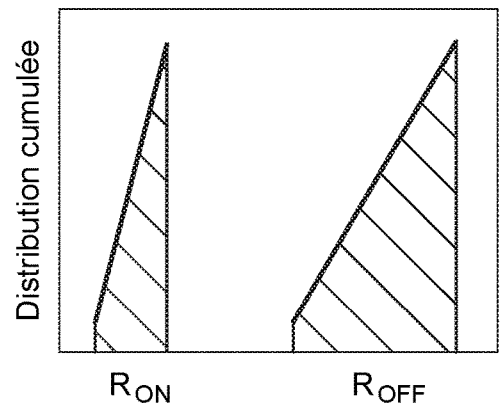

FIGS. 4A and 4B represent, respectively, examples of fluctuation of the resistances Roff and Ron, of a same memory cell, over several cycles, and the cumulative distribution of the resistance values Roff and Ron of a memory cell. More precisely, FIG. 4A represents the curve of the resistance values Roff which fluctuate around the first median resistance value Roffmed and the curve of the resistance values Ron which fluctuate around the second median resistance value Ronmed. Since the filament within the dielectric material has a variable shape at the end of each writing and erasure operation, the resistance of the dielectric material, which depends on the fluctuation of the filament, has stochastic values, not just in the high resistance state but also in the low resistance state. The method of an embodiment of the invention proposes adjusting the programming conditions of each memory cell as a function of the resistance value of the dielectric material at the end of each writing and erasure operation so as to compensate, at each operation, the fluctuations of the filament. Thus, the fact of determining, at each operation, the programming conditions to use at the following operation makes it possible to write and to erase data with optimal conditions which limit the generation of defects in the memory cell. The state of the dielectric material and its defects are thus compensated at each writing and erasure operation, before the memory has drifted too much. Indeed, the fact of compensating a drift of the resistance Roff or Ron rapidly after the birth of the drift makes it possible to stabilise the high or low resistance state, respectively, of the dielectric material.

According to certain embodiments, the programming conditions may be the programming voltage, that is to say the potential difference applied between the two electrodes of a stack, which makes it possible to write or erase data on/from the memory cell while ensuring a resistance value of the dielectric material close to the median resistance value. In such an embodiment, the voltage applied between the electrodes is variable and the duration of application of this voltage is constant. On the contrary, the programming conditions may be the duration of application of the voltage to the electrodes, which also corresponds to the number of pulses applied to the electrodes. In this case, the duration or the number of pulses is variable and the potential difference is constant. Indeed, those skilled in the art will understand that, due to the equivalence known in the field of resistive random access memories between the voltage level and the duration of placing under voltage, it is possible to apply to the electrodes, indiscriminately, either a voltage of constant value with a variable duration or number of pulses, or a voltage of variable value but with a constant duration or number of pulses.

In the examples that will now be described, the variable programming conditions will be the voltage applied between the electrodes of a memory cell, it being understood that similar examples could be described where the duration of application or the number of pulses could be variable rather than the voltage.

Figure 5A:
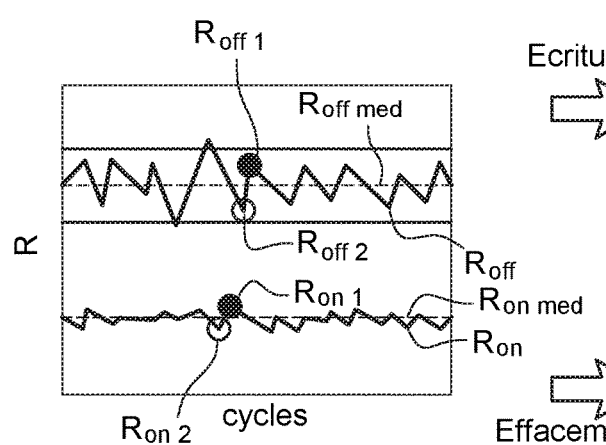
FIGS. 5A-5C represent examples of dependency laws used in the method according to an embodiment of the invention.
Figure 5B:
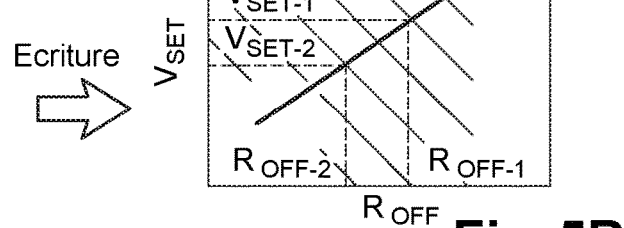
Figure 5C:
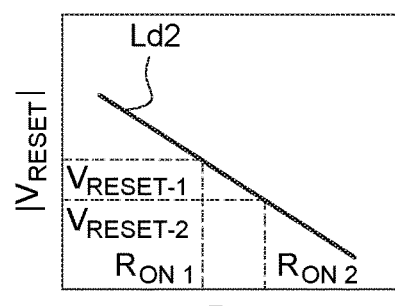

FIGS. 5A-5C represent examples of curves enabling the determination of programming voltages with the method according to an embodiment of the invention. In particular, FIG. 5A shows an example of a resistance value Roff1 and a resistance value Roff2, respectively, greater than and less than the median resistance value Roffmed as well as an example of a resistance value Ron1 and a resistance value Ron2, respectively, greater than and less than the median resistance value Ronmed. As represented in FIG. 5A, the median resistance values Ronmed and Roffmed follow a linear law and the resistance values Ron and Roff, read at the end of a writing and/or erasure operation, are compared with the respective median values Ronmed and Roffmed. The result of this comparison makes it possible to determine the programming conditions in the course of following erasure and/or writing operations.

Figures B and C represent median resistance values Ronmed and Roffmed that follow, respectively, a first and a second dependency laws referenced Ld1, Ld2. In particular, FIG. 5B shows the writing programming voltages Vset1 and Vset2 corresponding, according to the dependency law Ld1, to resistance values Roff1 and Roff2. FIG. 5C shows the erasure programming voltages Vreset1 and Vreset2 corresponding, according to the dependency law Ld2, to the resistance values Ron1 and Ron2.

In this example, if the resistance value in the state HRS, read at the end of an erasure operation, is Roff1, then the writing programming voltage in the course of the following writing operation will be Vset1. Similarly, if the resistance value in the state HRS, read at the end of an erasure operation, is Roff2, then the writing programming voltage in the course of the following writing operation will be Vset2.

In a similar manner, if the resistance value in the state LRS, read at the end of a writing operation, is Ron2, then the erasure programming voltage in the course of the following erasure operation will be Vreset2. And if the resistance value in the state LRS, read at the end of a writing operation, is Ron1, then the erasure programming voltage in the course of the following erasure operation will be Vreset1. Thus, the more the data has been erased with a high resistance value, the more the following data will be written in the memory cell with a high writing voltage value. The programming conditions are thus determined, before each writing and/or erasure operation, as a function of the resistances values read in the course of the preceding writing and/or erasure operations, taking account of the stochastic evolution of the resistance value of the dielectric material.

In an embodiment, an example of which is represented in FIG. 5B, the programming voltages may be comprised in a programming voltage window, such as the writing programming voltage window defined between Vset1 and Vset2. Such a programming voltage window has the benefit of preventing the application of a too high voltage, which limits the generation of defects in each memory cell.

The fact of applying, at each writing and/or erasure operation, a programming voltage adapted to the resistance of the dielectric material during the preceding writing and/or erasure operation makes it possible to limit the generation of defects in the material. The fact of limiting defects makes it possible to slow down the degradation of the memory and thereby to improve its endurance and thus its lifetime.

The dependency laws Ld1 and Ld2 between the programming voltage and the resistance values are laws predetermined during a preliminary calibration step. These laws differ according to the technology of the memory. For example, an OxRRAM type resistive random access memory with a layer of hafnium oxide as dielectric material will have dependency laws different to those of a CBRAM memory with a germanium sulphide layer.

These dependency laws may be determined by calculations, for example, by simulation using RRAM models. These dependency laws Ld1 and Ld2 may also be determined experimentally, by successive measurements. For example, the dependency law Ld1 relative to the writing voltage as a function of the resistance values Roff of the high resistance state may be constructed in the following manner: by considering several memory cells with different initial resistance values Roff, several writing pulses (with a constant pulse duration) are applied successively while increasing the writing voltage at each pulse. The voltage from which the memory cell is written (thus when the high resistance state switches to the low resistance state) is defined as the writing voltage (Vset). The fact of applying this technique to several initial resistance values Roff makes it possible to construct the curve representative of the dependency law Ld1, for a given pulse duration.

In a similar manner, the dependency law Ld2 relative to the erasure voltage as a function of the resistance values Ron of the low resistance state may be constructed in the following manner: by considering several memory cells with different initial resistance values Ron, several erasure pulses (with a constant pulse duration) are applied successively while increasing the erasure voltage at each pulse. The voltage from which the memory cell is erased (thus when the low resistance state switches to the high resistance state) is defined as the erasure voltage (Vreset). The fact of applying this technique to several initial resistance values Ron makes it possible to construct the curve representative of the dependency law Ld2, for a given pulse duration.

According to other embodiments, the dependency law links the duration of application (or the number of pulses) at constant voltage, with the resistance value. For example, in the case of determination by successive measurements, the dependency law Ld1 relative to the writing pulse duration as a function of the resistance values Roff of the high resistance state may be constructed in the following manner: by considering several memory cells with different initial resistance values Roff, several writing pulses (with a constant voltage value) are applied successively while increasing the writing time at each pulse. The pulse duration from which the memory cell is written (thus when the high resistance state switches to the low resistance state) is defined as the writing time (Tset). The fact of applying this technique to several initial resistance values Roff makes it possible to construct the curve representative of the dependency law Ld1, for a given voltage value.

In a similar manner, the dependency law Ld2 relative to the erasure pulse duration as a function of the resistance values Ron of the low resistance state may be constructed in the following manner: by considering several memory cells with different initial resistance values Ron, several erasure pulses (with a constant voltage value) are applied successively while increasing the erasure time at each pulse. The pulse duration from which the memory cell is erased (thus when the low resistance state switches to the high resistance state) is defined as the erasure time (Vreset). The fact of applying this technique to several initial resistance values Ron makes it possible to construct the curve representative of the dependency law Ld2, for a given voltage value.

Figure 6:
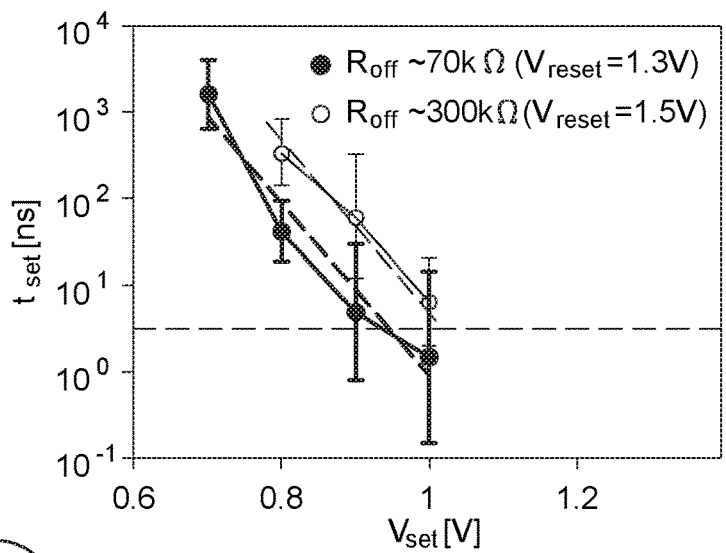
FIG. 6 represents an example of a law linking the duration of application of a voltage with the value of the voltage.

In other embodiments, the law linking the duration or the number of pulses with the voltage value is known and may be represented in the form of a curve such as that represented in FIG. 6. In these embodiments, the duration or the number of pulses are deduced from the dependency law linking the voltage value with the resistance value or, conversely, the programming voltage value is deduced from the dependency law linking the duration or the number of pulses with the resistance value.

Whatever the dependency law chosen, the method according to an embodiment of the invention comprises the following steps:
  reading, at the end of a writing or erasure operation (n−1), the resistance value of the dielectric material;
  comparing this read resistance value with reference values such as median resistance values, by means of one of the methods described hereafter;
  determining the programming conditions from the result of this comparison;
  applying, to the memory cell, programming conditions determined for the following erasure or writing operation n.

According to a first alternative, the comparison of the read resistance value with reference values may be carried out by comparing the read resistance value with several detection amplifiers (or sense amplifiers) of different levels. According to a second alternative, this comparison may also be carried out by comparing the current level in the memory cell with that extracted by a current ramp connected to a counter so as to detect the instant where the two currents are equal. This second alternative, although slower than the first alternative, enables a more precise determination of the resistance value with a single comparator.

As explained previously, the resistance value Ron or Roff read at the end of a writing or erasure operation is memorised in memory cells of the resistive random access memory. According to certain embodiments, the memory space dedicated to the implementation of the method of the invention may be optimised by only memorising, for example, the values of memory cells considered as the most sensitive by the user such as, for example, the cells the most often erased and rewritten of the resistive random access memory and/or the memory cells using the highest programming voltages.

Indeed, the method of an embodiment of the invention—with adaptation of the writing conditions—may only be implemented for a fraction of the total memory, which corresponds to a reduced number of memory cells. This reduced number of memory cells may be chosen, by the user, as sensitive cells.

According to certain embodiments, an associative memory is used to store the addresses and erasure conditions: the "tag" part of this associative memory may, for example, be realised in ReRAM because not written very often. The erasure conditions are encoded in SRAM, a technology not subject to wear. The method of an embodiment of the invention is only used on a small portion of the memory because the size of SRAM memories is greater than that of ReRAM.

According to certain embodiments, the memory space dedicated to the implementation of the method of the invention may be optimised by using the cache memory zones of the resistive random access memory to store momentarily the values of the erasure conditions and to use them at the moment where the cache memory has to be emptied to store therein another data. The cache memory is then used to store successively several data of different types.

According to certain embodiments, the memory space dedicated to the storage of the read values may be optimised by only storing a tendency of the writing and/or erasure conditions to apply, this tendency being able to be more or less precise. For example, to reduce the number of memory cells required for the storage of the read conditions, it is possible to encode, on a single memory cell, the tendencies "increase the writing voltage" and "decrease the writing voltage". While increasing the number of memory cells, the nuance of the tendency may be refined; for example, by encoding on two memory cells, it is possible to encode the information "apply the median voltage+n %", "apply the median voltage−n %", "apply the median voltage+2n %" and "apply the median voltage−2n %".

Those skilled in the art will understand that a high number of memory cells dedicated to the implementation of the method of the invention make it possible to encode refined programming conditions. They will understand, moreover, that several of the embodiments described previously may be implemented simultaneously in order to optimise as best as possible the ratio between the memory space dedicated to the implementation of the method and the precision of the determination of the programming conditions.

The method according to an embodiment of the invention may be implemented in a device for programming a resistive random access memory. This device may comprise a programming circuit, connected to the upper and lower electrodes of each memory cell of the memory.

Figure 7A:
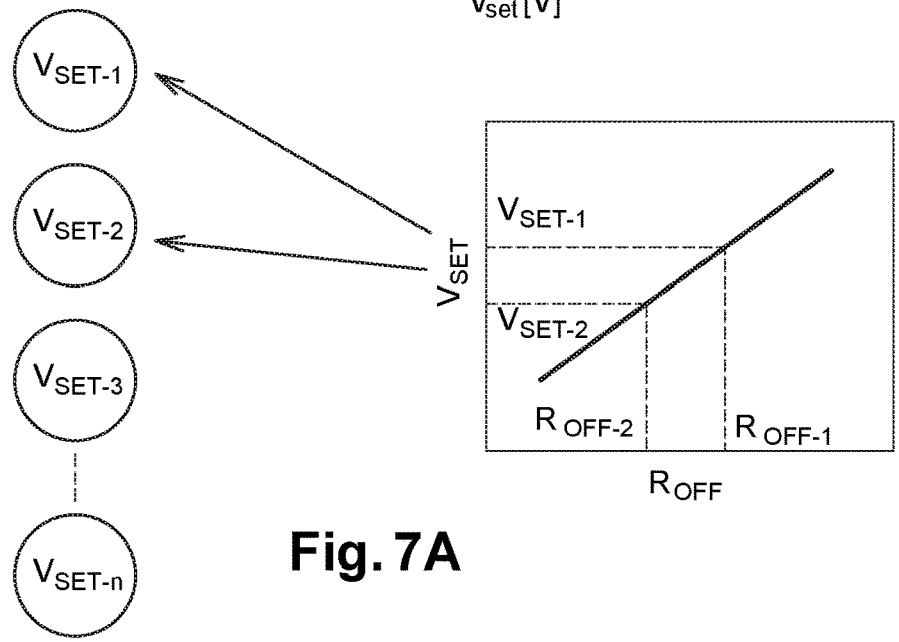
FIGS. 7A and 7B schematically represent two implementations of the adjustment of the programming conditions.

According to certain embodiments, the programming circuit comprises a plurality of voltage generators each capable of delivering at least one programming voltage value different to the voltage value delivered by the other generators. Indeed, to apply the programming voltage values determined by the method of the invention, several voltage generators may be necessary, as represented in FIG. 7A. The programming circuit may then choose, among the voltage generators, the number and the combination of these generators which make it possible to approach as best as possible the determined programming voltage value. However, in order to limit the number of voltage generators, each generator may comprise dividing bridges which, by divisions of a reference voltage, make it possible to apply to the electrodes the programming voltage value the closest to the determined value.

Figure 7B:
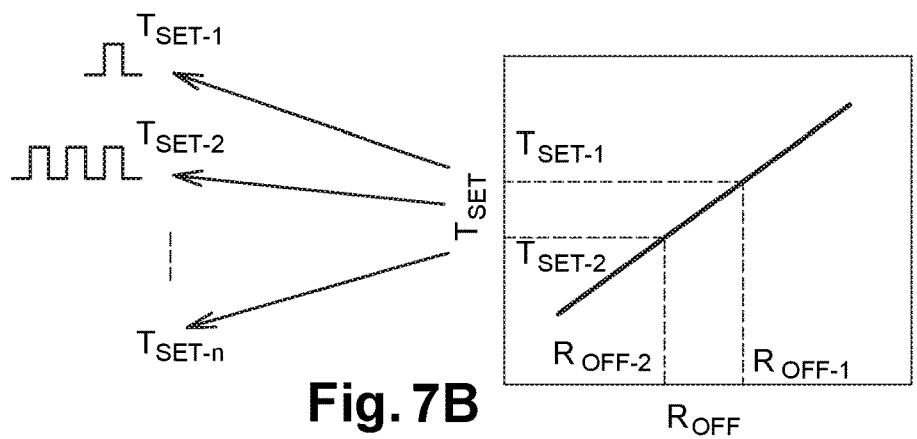

According to certain other embodiments, the programming circuit comprises a single (or several) voltage generator(s) (each) delivering a constant voltage value. This voltage generator is connected to at least one counter and/or one clock capable of controlling the duration or the number of pulses of constant voltage to apply to the electrodes to obtain a result identical to that which would have been obtained with a programming voltage value determined in the embodiments where the voltage is variable. An example of application of the number of pulses at a constant voltage, determined with the method according to the invention, for a writing operation is schematically represented in FIG. 7B.

Thus, the method according to an embodiment of the invention makes it possible to manage the endurance of a resistive random access memory by determining, at each cycle, the writing and erasure conditions of each memory cell at the following cycle. The method according to an embodiment of the invention thereby makes it possible to improve the endurance of a resistive random access memory and, consequently, to increase the lifetime of the memory.

Although described through a certain number of examples, alternatives and embodiments, the method for managing endurance according to the invention and the programming device implementing this method include various alternatives, modifications and improvements which will be obviously apparent to those skilled in the art, it being understood that these alternatives, modifications and improvements form part of the invention.

The invention claimed is:

1. A method for managing the endurance of a non-volatile rewritable memory including a plurality of ordered stacks of a lower electrode, a layer of dielectric material and an upper electrode, the dielectric material of each stack being capable of switching between:
    a high resistance state, in which said dielectric material has a first resistance value, and
    a low resistance state, in which said dielectric material has a second resistance value, a switching between the high resistance state and the low resistance state allowing a writing in the memory and a switching between the low resistance state and the high resistance state allowing an erasure in the memory,
the method comprising at least one of the following operations:
    at the end of each erasure operation: reading the first resistance value of the dielectric material, comparing said first resistance value with a first predetermined median resistance value, and determining writing programming conditions from the results of said comparison; and
    at the end of each writing operation: reading the second resistance value of the dielectric material, comparing said second resistance value with a second predetermined median resistance value, and determining erasure programming conditions from the results of said comparison,
the first and second median resistance values following, respectively, a first and a second predetermined dependency laws, linking respectively the writing and erasure programming conditions and the first and second read resistance values,
said writing and erasure programming conditions being applied to the electrodes of the stack during, respectively, following writing and erasure operations in order to limit the generation of defects in the dielectric material.

2. The method according to claim 1, wherein the writing and erasure programming conditions include a writing and erasure programming voltage applied between the electrodes of each stack for a constant duration.

3. The method according to claim 1, wherein the writing and erasure programming conditions include a duration of application of a voltage between the electrodes of each stack, said voltage being constant.

4. The method according to claim 1, wherein each dependency law is calibrated prior to all writing and erasure operations.

5. The method according to claim 1, wherein the determined writing or erasure programming conditions are memorised at least partially up to the following writing or erasure operations, in at least one memory cell of the memory.

6. A device for programming a non-volatile rewritable memory comprising a programming circuit connected to the electrodes of each stack of the memory, the device configured to implement the method according to claim 1.

7. The device according to claim 6, wherein the programming circuit comprises a plurality of voltage generators each capable of generating at least one programming voltage value.

8. The device according to claim 6, wherein the programming circuit comprises at least one voltage generator connected to dividing bridges.

9. The device according to claim 6, wherein the programming circuit comprises at least one voltage generator connected to at least one counter and/or one clock capable of modulating a duration of application of a constant voltage to the electrodes.

* * * * *